United States Patent

Harris, II et al.

[11] Patent Number: 5,867,719
[45] Date of Patent: Feb. 2, 1999

[54] METHOD AND APPARATUS FOR TESTING ON-CHIP MEMORY ON A MICROCONTROLLER

[75] Inventors: Joseph M. Harris, II, Cedar Park; John P. Dunn, Austin; Tony Tong-Khay Cheng, Austin; James C. Nash, Austin, all of Tex.

[73] Assignee: Motorola, Inc., Schaumburg, Ill.

[21] Appl. No.: 669,863

[22] Filed: Jun. 10, 1996

[51] Int. Cl.[6] ............................................ G06F 1/32
[52] U.S. Cl. ........................ 395/750.05; 395/750.01; 395/750.06; 365/201
[58] Field of Search .................... 395/750, 311, 395/432, 433, 750.01–750.08; 711/105, 104, 106; 365/201, 226–229

[56] References Cited

U.S. PATENT DOCUMENTS

| | | | |
|---|---|---|---|
| 5,079,744 | 1/1992 | Tobita et al. | 365/201 |
| 5,127,096 | 6/1992 | Kaneko et al. | 395/412 |
| 5,283,905 | 2/1994 | Saadeh et al. | 395/750 |
| 5,594,694 | 1/1997 | Roohparvar et al. | 365/201 |
| 5,615,159 | 3/1997 | Roohparvar | 365/201 |

*Primary Examiner*—Meng-Ai T. An
*Assistant Examiner*—Ario Etienne
*Attorney, Agent, or Firm*—Keith E. Witek

[57] ABSTRACT

A method and apparatus for allowing the soft defect detection testing (SDDT) of an memory array (106) of a data processor (100) begins by providing a control value to a memory controller (111). The control value determines whether a switching circuit (104) will apply a VDD power supply voltage from a VDD terminal (132) or a Vstby power supply voltage from a Vstby terminal (130) to a selected portion of the memory array (106). When in an SDDT test mode, the selected portion of the memory array (106) is supplied by the Vstby terminal (130). While being supplied by the Vstby terminal (130), the selected portion of the memory array (106) is SDDT tested by coupling a current detection device to the pin (130) and measuring a current I drawn by the selected portion of the memory array (106).

25 Claims, 3 Drawing Sheets

5,867,719

METHOD AND APPARATUS FOR TESTING ON-CHIP MEMORY ON A MICROCONTROLLER

FIELD OF THE INVENTION

This invention relates generally to semiconductor devices, and specifically to testing random access memory (RAM) on-board a microcontroller.

BACKGROUND OF THE INVENTION

As modern processor speeds have increased over time, the use of on-chip static random access memory (SRAM) has become more common. An advantage of SRAM memories is that they do not require refresh cycles to retain data. Dynamic random access memories (DRAMs) do require refresh operations which can result in adverse power consequences which are not suffered when using SRAM technology. However, a problem exists with all types of SRAMs in that perfect data retention potential has not been realized due to soft error rate phenomenon. In other words, open circuit defects, dubbed soft defects, are capable of causing retention failures and can be undetectable using conventional retention detection techniques.

In order to address this issue, a set of open circuit tests and memory current tests, termed as soft defect detection testing (SDDT), has been developed. One test in this set of tests is known as an array current test (ACT). During the array current test, the amount of current being drawn by a given memory block or memory array is measured by an on-board current detect circuit in the prior art. Since the amount of current used by a memory cell which contains a soft defect is greater than those which are non-defective, it can be determined whether or not a soft defect is present through a current measurement.

A problem exists with prior art array current tests as used on microcontrollers or processors, in that the on-board current detection circuit often requires multiple design passes and mask changes in order to determine the actual current range in which to operate. This is because for new integrated circuit designs the precise current level of a memory array is not known until devices are manufactured onto silicon wafers. Therefore, on the first set of manufactured wafers, the current detection circuitry is usually manufactured to specifications which do not allow for proper memory array current measurement. Due to this first improper design, significant redesign of the on-board current detection devices are needed to obtain proper SDDT testing. Therefore, the need exists for an array current test which eliminates the necessity for making multiple mask versions of a design in order to obtain proper current measurements for SDDT testing.

DESCRIPTION OF A PREFERRED EMBODIMENT

In general, the present invention is a microprocessor or microcontroller design. The microprocessor is a packaged integrated circuit which consists of at least one internal switch within a switching circuit. The switching circuit receives a first supply voltage from a VDD external terminal and a second supply voltage from a second voltage source which is typically a Vstby pin (a power supply voltage standby terminal). At least one switch in the switching circuit is used to determine which of the two power supply voltages, either VDD or Vstby will be supplied to one or more banks or arrays of random access memory (RAM) which are located within the integrated circuit. The selection of VDD or Vstby to the memory array is software programmable through a register accessed by a CPU core of the microprocessor design. The use of two voltage supply pins (one for memory and one for the rest of the circuit) allows for on-chip memory or a portion of on-chip memory to be selectively decoupled from the other circuit. Once decoupling has occurred, an array current test (ACT) can be performed on the on-chip memory by measuring the current (I) consumed by the RAM coupled to the Vstby pin while all other non-array-current-tested portions of the microcontroller are powered by VDD. The result being that mask changes and current detection circuitry redesign of the prior art is eliminated creating a lower cost SDDT process and improved time to market.

The invention can be further understood with reference to FIGS. 1-3 below.

Figure 1:
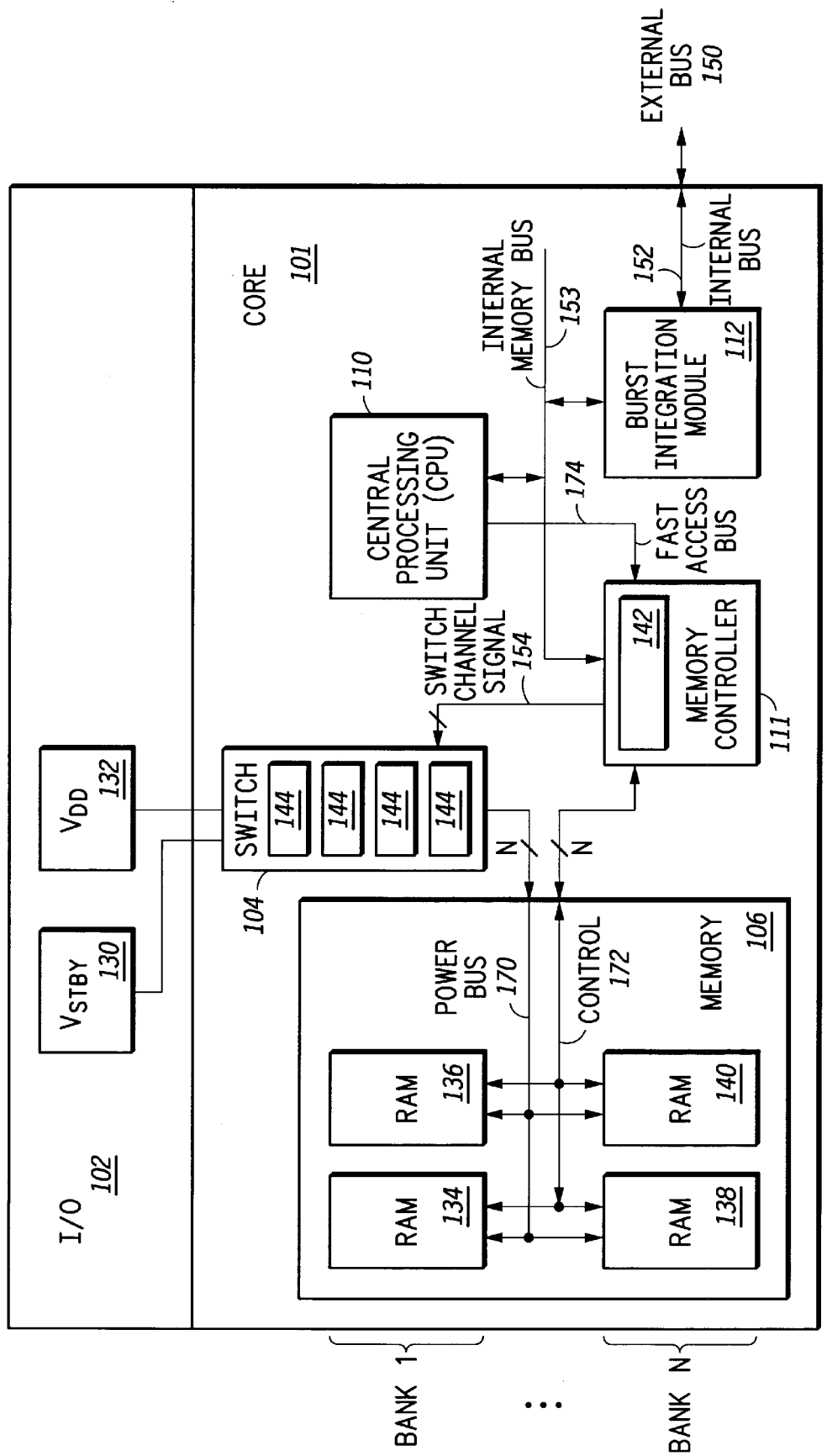
FIG. 1 illustrates, in a block diagram, a data processor in accordance with the present invention.

FIG. 1 illustrates a data processor 100 accordance with the present invention. The data processor 100 of FIG. 1 contains an input/output (I/O) section 102 which contains external terminals of the packaged integrated circuit which contains the data processor, a core 101, and an external bus 150. Specifically, the I/O section 102 comprises a VDD terminal 132, and a Vstby terminal 130. The core 101 comprises a memory portion 106. Memory portion 106 contains N banks of memory wherein N is any finite positive integer. Each bank of RAM can contain more than one block or array of RAM sections 134, 136, 138, and 140 as illustrated in FIG. 2.

The core 101 also contains a switch circuit 104 containing a plurality of switches 144, a central processing unit (CPU) 110, a memory controller 111, and an integration module 112. The Vstby terminal 130 is coupled to the switch circuit 104, and the VDD terminal 132 is also coupled to the switch circuit 104. The switch circuit 104 is coupled to the RAM sections 134–140 through a power distribution bus 170, and the switch circuit 104 receives a switch control/channel signal 154 from the memory controller 111. The switch control signal 154 is software controlled or software programmable and is used to set a configuration of the switches 144 to control power supply distribution in the data processor 100. The memory controller 111 is coupled to the memory 106, the fast access bus (FAB) 174, and generates the switch control signal 154. The memory controller 111 is also coupled to the intermodule bus 153 to communicate with the CPU 110 and the burst integration module (BIM). The CPU 110 is coupled to the intermodule bus (IMB) 153, and is coupled to the fast access bus (FAB) 174. The burst integration module 112 is coupled to the intermodule bus (IMB) 153, and the internal bus 152.

The memory 106 is illustrated in FIG. 1 as having a RAM block 134, RAM block 136, RAM block 138, and RAM block 140. However, more or fewer memory blocks may be designed into the integrated circuit. Each of the RAM blocks is connected to at least one line of the power bus 170 as provided by switch 104, and the control bus 172 as provided by the memory controller 111. The control bus 172 provides for read/write access to the RAM portions 134–140.

In a normal mode of operation, the core 101 would be powered by a supply voltage applied to VDD terminal 132. During a soft defect detection test (SDDT), it is necessary to determine the amount of current being used by a given RAM block when isolated from all other circuitry within the processor 100. As discussed previously, this would normally be done in the prior art by a current detection circuit on board the microcontroller or microprocessor within core 101. The present invention allows for the elimination of this on-board detect circuit. When an array current test needs to be performed, the CPU 110 will write to a register 142 located within the memory controller 108. This register value will indicate which of the RAM block 134–140, the array current test is to be performed upon.

The power supply (VDD or Vstby) to the selected block or blocks 134–140 is controlled by switch 104 which monitors the register 142 to determine the when the test mode is entered. In a preferred embodiment of the invention, there would be four RAM banks where N=4 in FIG. 1. Each of the RAM banks would have a switch dedicated to controlling a source from where its power supply voltage is received. In another form, all of the RAM banks may receive the same VDD or Vstby signal in unison. In yet another form, a complex decoder and supply routing system may be used to allow for line-by-line or bit-by-bit SDDT testing of smaller groups of RAM cells within the banks 134–140. In all SDDT current test cases, some portion of memory 106 will be powered with Vstby 130 while all other circuitry in processor 100 is powered by VDD 132.

For one example, if bank 1 was defined to be RAM 134 and RAM 136, the CPU 110 would write a test initiation value to register 142. This value within the register will control switch 104. In one embodiment of the invention, a single bit of register 142 could effectively turn on all switches 144 of switch 104. This would allow all of the RAM banks to be powered by the Vstby terminal 130. As such, an external current-measuring device or microprocessor tester could monitor the current I drawn through Vstby terminal 130 and determine whether or not a soft defect is present in one or more sections on memory 106 without the need for on-chip current detection measures. In another embodiment, the register 142 could individually control banks of memory independent of each other for independent bank testing, or even control individual row and column accesses of a RAM bank to make even finer determinations as to whether a soft defect exists. This would allow a design team to pinpoint manufacturing or design defects in a memory array of a microprocessor in a more efficient manner.

In addition to performing the function of providing an alternative VDD to the RAM block when software selected, the Vstby pin has a hardware controlled function as well. The hardware controlled function is the normal standby voltage function of the Vstby pin. Usually, the voltage level on the terminal VDD 132 is monitored to ensure that a functional voltage is provided for all time on the pin 132. When this VDD voltage level drops below a set level or threshold, the voltage on the Vstby terminal 132 is switched to power the memory 106 to sustain memory contents when either main or VDD power is failing. Normally, Vstby will be powered from a battery back-up source and may or may not be a voltage equal to that supplied by VDD. Therefore, the present invention allows for dual functionality of the voltage standby (Vstby) pin. One function being a VDD failure mode where a failure is detected on the VDD pin 132 and Vstby must be substituted for VDD to avoid memory data loss, and the other mode being software controlled mode which allows for the testing of soft defects using an external SDDT current measurement which is improved over the prior art.

Figure 2:
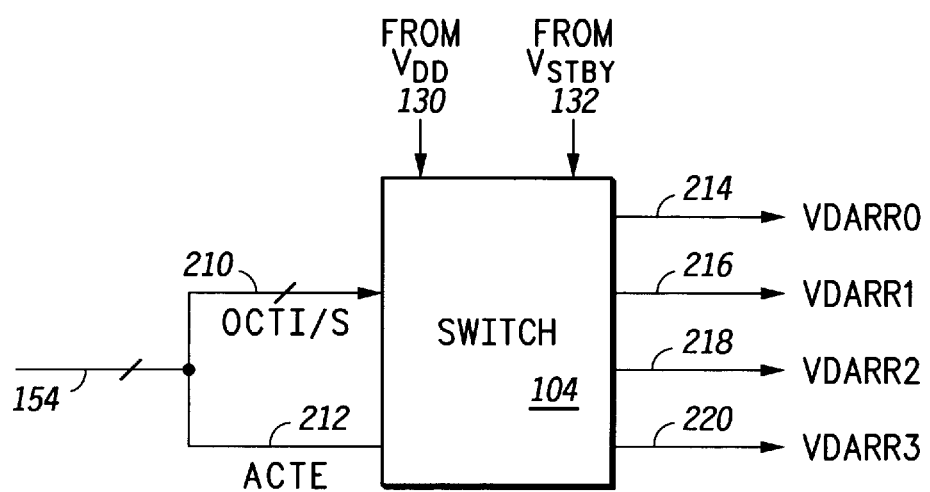
FIG. 2 illustrates, in a block diagram, a switching circuit from FIG. 1 in more detail and in accordance with the present invention.

FIG. 2 illustrates in greater detail the switch 104 of FIG. 1. Switch control bus 154 provides the array current test enable signal (ACTE) 212 and the open circuit test input and open circuit test select signals (OCTI/S) 210. The switch 104 has outputs VDarr 0, VDarr 1, VDarr 2, and VDarr 3 (which stand for Voltage applied to array #). The switch 104 also receives the voltage from VDD terminal 132, and the voltage applied to the Vstby terminal 130 where one of these two signals (VDD or Vstby) are multiplexed out onto each of the VDarr# pins depending upon input control signals 154.

In operation, the array current test enable pin (ACTE) 212 will determine whether or not the VDarr 0 through VDarr 3 pins are switched to provide current from the VDD pin 132 or the Vstby pin 130. In another embodiment, other array current test pins could be used to determine which specific VDarr pins are switched to VDD or Vstby. For example, in one embodiment, it would be possible to select just the VDarr 2 pin, while in another embodiment, all VDarr # signal must carry a same voltage either VDD or Vstby. Clearly, there is a tradeoff between testability and silicon area consumption/complexity.

Figure 3:
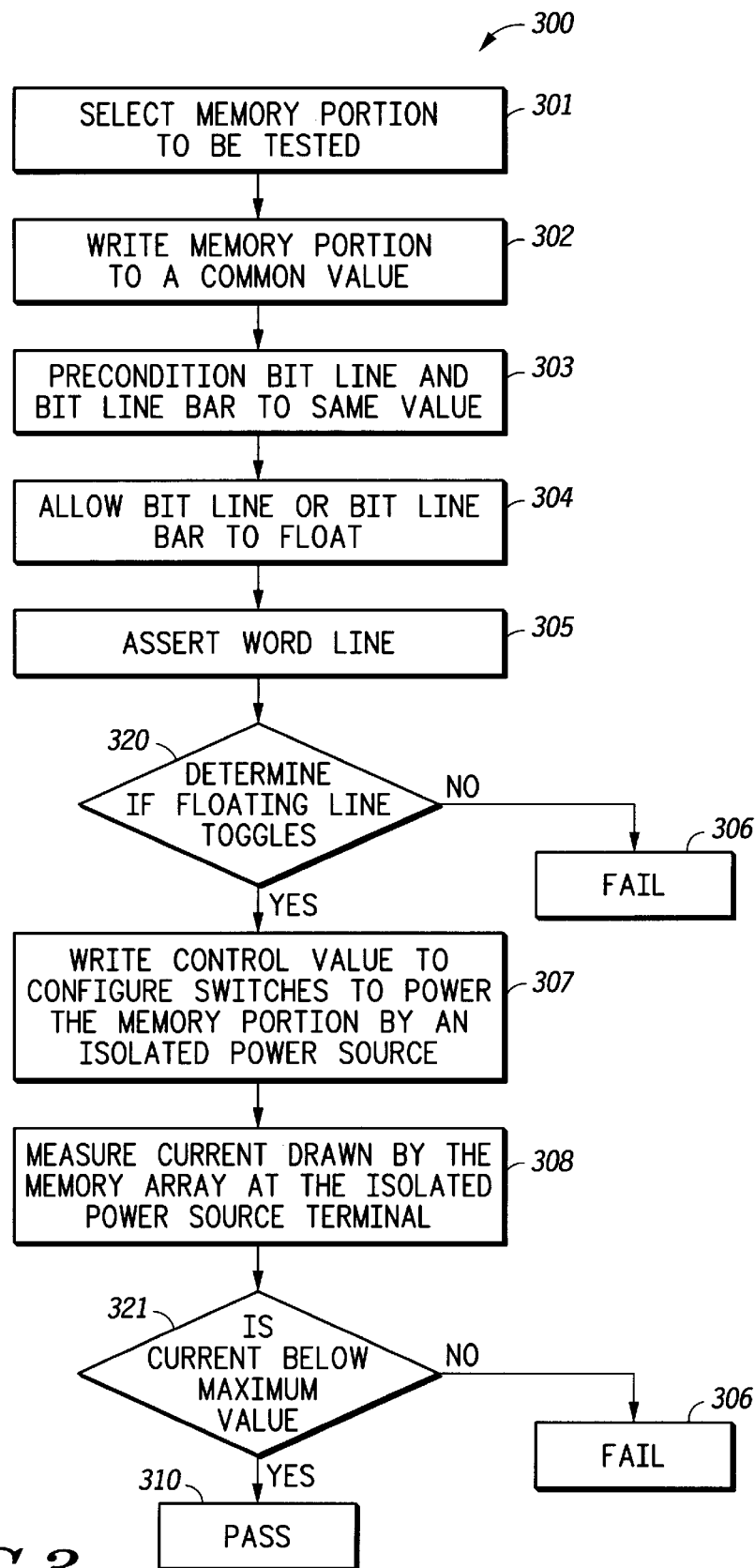
FIG. 3 illustrates, in a flow diagram, a method used to test on-chip memories in accordance with the present invention.

FIG. 3 illustrates a process for implementing the soft defect detection tests. The soft defect detection test set consists of a total of five tests, the last of which is the array current test (ACT). The flow 300 consists of rectangular step boxes 301–309, and diamond shaped decision block 320. At step 301, a memory portion is selected to be tested. Next, at step 302, all bits in the memory portion are written to a common value. For example, all bits in the memory portion could be written to a value of 0 or a value of 1. Next, during step 303, the bit line (BL) and bit line bar (BLB) lines of the appropriate memory portion are preconditioned. For purposes of the invention, preconditioning means that the bit line and bit line bar lines will be in one of two states. The first state being with bit line and bit line bar high, and the second state being bit line bar and bit line low. Next, at step 304, either the bit line or the bit line bar is allowed to float. Next, at step 305, the word line is asserted. Next, at step 306, a determination is made whether or not the floating line toggles. If the floating line toggles, the test was successful. If the floating line does not toggle, the test has failed and the part would be rejected. At step 309, the part is rejected following the floating line not toggling. At step 307, the array current test is performed following a successful toggling of the floating line. During step 307, a control value is written to configure the switches to power the memory portion by an isolated power source. Next, at step 308, the current drawn by the memory portion is measured at the isolated power source terminal. At step 321, a determination is made whether or not the current actually drawn is below a maximum value. If the part is below a maximum current value, the flow precedes to step 310 and the part passes or is accepted. In the event the current is above a maximum value, flow proceeds to a step 309 where the part is rejected.

While the invention has been described in the context of a preferred embodiment, it will be apparent to those skilled in the art that the present invention may be modified in numerous ways and may assume many embodiments other than that specifically set out and described above. For example, the test mode of the data processor data processor taught herein may be used as a low power feature wherein the second power supply voltage (Vstby or Vdd) is provided to the at least one memory array while the first power supply voltage (Vdd or Vstby) which is being supplied to the CPU is lowered so that lower power is consumed in the data processor while data within the at least one memory array is maintained. Accordingly, it is intended by the appended claims to cover all modifications of the invention which fall within the true spirit and scope of the invention.

What is claimed is:

1. A data processor comprising:

a central processing unit (CPU);

a switching circuit coupled via control signals to the CPU;

a first input terminal of the data processor for providing a first power supply voltage to the switching circuit;

a second input terminal of the data processor for providing a second power supply voltage to the switching circuit;

a memory access control circuit coupled to the CPU for controlling CPU memory access;

at least one memory array within the data processor, the at least one memory array being coupled to the memory access control circuit;

wherein the switching circuit is used to provide the first power supply voltage to the at least one memory array in a normal mode of operation, and wherein the switching circuit is used to provide the second power supply voltage to the at least one memory array in a test mode of operation where a current supplied to the at least one memory array in the test mode of operation is capable of being measured by coupling a current sensing device to the second input terminal of the data processor;

wherein a current drawn by the CPU through the first input terminal is substantially decoupled from a current drawn by the at least one memory array through the second input terminal when in the test mode of operation; and wherein the at least one memory array comprises N banks of memory and wherein the switching circuit contains a plurality of switches so that pieces of the N banks of memory can be selectively coupled to receive the second power supply voltage when in the test mode of operation.

2. The data processor of claim 1 wherein the CPU is supplied with the first power supply voltage when the data processor is in the test mode of operation.

3. The data processor of claim 1 wherein current measurement operations are enabled by writing a test value to a register located within the memory access control circuit.

4. The data processor of claim 1 further comprising:

a burst integration module (BIM) coupled to the CPU and the memory access control circuit to allow information in the at least one memory array to be communicated external to the data processor.

5. The data processor of claim 1 wherein an array test current (ATC) operation is performed in a portion of the N banks of memory while other of the N banks of memory are excluded from the ATC operation.

6. The data processor of claim 1 wherein the test mode of operation may be used as a low power feature wherein the second power supply voltage is provided to the at least one memory array while the first power supply voltage which is being supplied to the CPU is lowered so that lower power is consumed in the data processor while data within the at least one memory array is maintained.

7. The data processor of claim 1 wherein the test mode of operation may be used as a low power feature wherein the first power supply voltage is provided to the CPU while the second power supply voltage which is being supplied to the at least one memory array is lowered so that lower power is consumed in the data processor in a manner wherein the CPU is functional but the at least one memory array is disabled.

8. The data processor of claim 1 wherein the second power supply voltage is also used in the data processor as a standby power source wherein the second power supply voltage will be used to replace the first power supply voltage if the first power supply voltage falls below a voltage threshold.

9. The data processor of claim 1 wherein the switching circuit is software programmable so that a configuration of the switching circuit can be altered by writing control values from the CPU to the switching circuit.

10. A method for testing an integrated circuit, the method comprising the steps of:

providing the integrated circuit wherein the integrated circuit internally has a plurality of memory banks, a switching circuit, and a central processing unit (CPU), the integrated circuit having a first external terminal for receiving a first power supply voltage and a second external terminal for receiving a second power supply voltage;

providing a first control signal from the CPU to the switching circuit to configure the switching circuit so that the first power supply voltage is supplied to the CPU while the second power supply voltage is supplied to the plurality of memory banks;

coupling a current measurement device to the second external terminal to measure a current which drawn through the plurality of memory banks while the second power supply voltage is being provided to the plurality of memory banks; and providing a second control signal from the CPU to the switching circuit, after the step of coupling a current measurement device, to configure the switching circuit so that the first power supply voltage is provided to both the CPU and the plurality of memory banks.

11. The method of claim 10 wherein the step of providing the first control signal comprises:

supplying the first power supply voltage to the CPU and a portion of the plurality of memory banks while a different portion of the plurality of the memory banks are supplied with the second power supply voltage.

12. The method of claim 10 wherein the step of providing a first control signal comprises:

configuring the switching circuit so that only a portion of the plurality of memory banks are selected to receive the second power supply voltage whereas a remaining portion of the plurality of memory banks continue to receive the first power supply voltage.

13. The method of claim 12 wherein the step of providing a first control signal comprises:

configuring the switching circuit so that at least one selected bit cell within the portion of the plurality of memory banks is selected to receive the second power supply voltage whereas a remaining portion of the plurality of memory banks continue to receive the first power supply voltage.

14. The method of claim 10 wherein the step of coupling a current measurement device comprises:

allowing the current measurement device to perform a portion of a soft defect detect test (SDDT).

15. The method of claim 10 further comprising:

configuring the switching circuit so that the first power supply voltage is supplied to both the plurality of memory banks and the CPU when a reset of the integrated circuit is performed.

16. An integrated circuit comprising:

a first circuit internal to the integrated circuit;

a second circuit internal to the integrated circuit;

a first external terminal of the integrated circuit which is coupled to receive a first power supply voltage;

a second external terminal of the integrated circuit which is coupled to receive a second power supply voltage;

a switching circuit coupled to the first circuit, the second circuit, the first external terminal, and the second external terminal; and wherein the switching circuit can be configured to operate: (1) in a first mode where the first external terminal is coupled to the first circuit and the second external terminal is coupled to the second circuit; or (2) in a second mode of operation where the first external terminal is coupled to both the first and second circuit.

17. The integrated circuit of claim 16 wherein the first power supply voltage supplied by the first external terminal is reduced when in the first mode to reduce an amount of power consumed by the integrated circuit while the second power supply voltage is maintained in an operational state.

18. The integrated circuit of claim 16 wherein the second power supply voltage supplied by the second external terminal is reduced when in the first mode to reduce an amount of power consumed by the integrated circuit while the first power supply voltage is maintained in an operational state.

19. A data processor comprising:

a central processing unit (CPU);

a plurality of switches coupled via control signal lines to the CPU;

a first external terminal of the data processor coupled to provide a first power supply voltage to the plurality of switches;

a second external terminal of the data processor coupled to provide a second power supply voltage to the plurality of switches;

a memory controller coupled to the CPU;

a first memory bank coupled to the memory controller and coupled to a first switch in the plurality of switches;

a second memory bank coupled to the memory controller and coupled to a second switch in the plurality of switches;

a third memory bank coupled to the memory controller and coupled to a third switch in the plurality of switches;

a fourth memory bank coupled to the memory controller and coupled to a fourth switch in the plurality of switches; and wherein the plurality of switches are configured by the CPU to operate in one of two modes of operation: (1) a first mode being where the CPU and all of the first though fourth memory banks are coupled to receive the first power supply voltage from the first external terminal; and (2) a second mode being where the CPU is coupled to receive the first power supply voltage from the first external terminal and all of the first though fourth memory banks are coupled to receive the second power supply voltage from the second external terminal.

20. The data processor of claim 19 wherein the plurality of switches are configured by the CPU to provide for four more additional modes of operation, the additional modes of operation being: (3) a third mode where the CPU is coupled to receive the first power supply voltage and the first, second, and third memory banks are coupled to receive the first power supply voltage from the first external terminal while the fourth memory bank is coupled to receive the second power supply voltage from the second external terminal; (4) a fourth mode where the CPU is coupled to receive the first power supply voltage and the first, second, and fourth memory banks are coupled to receive the first power supply voltage from the first external terminal while the third memory bank is coupled to receive the second power supply voltage from the second external terminal; (5) a fifth mode where the CPU is coupled to receive the first power supply voltage and the first, third, and fourth memory banks are coupled to receive the first power supply voltage from the first external terminal while the second memory bank is coupled to receive the second power supply voltage from the second external terminal; and (6) a sixth mode where the CPU is coupled to receive the first power supply voltage and the second, third, and fourth memory banks are coupled to receive the first power supply voltage from the first external terminal while the first memory bank is coupled to receive the second power supply voltage from the second external terminal.

21. A data processor comprising:

a central processing unit (CPU);

a plurality of switches coupled via control signal lines to the CPU;

a first external terminal of the data processor coupled to provide a first power supply voltage to the plurality of switches;

a second external terminal of the data processor coupled to provide a second power supply voltage to the plurality of switches;

a memory controller coupled to the CPU;

a first memory bank coupled to the memory controller and coupled to a first switch in the plurality of switches;

a second memory bank coupled to the memory controller and coupled to a second switch in the plurality of switches;

a third memory bank coupled to the memory controller and coupled to a third switch in the plurality of switches;

a fourth memory bank coupled to the memory controller and coupled to a fourth switch in the plurality of switches; and wherein the plurality of switches are configured by the CPU to operate in one of two modes of operation: (1) a first mode being where the CPU and all of the first though fourth memory banks are coupled to receive the first power supply voltage from the first external terminal; and (2) a second mode being where the CPU is coupled to receive the second power supply voltage from the first external terminal and all of the first though fourth memory banks are coupled to receive the first power supply voltage from the second external terminal.

22. A data processor comprising:

a central processing unit (CPU);

a switching circuit coupled via control signals to the CPU;

a first input terminal of the data processor for providing a first power supply voltage to the switching circuit;

a second input terminal of the data processor for providing a second power supply voltage to the switching circuit;

a memory access control circuit coupled to the CPU for controlling CPU memory access;

at least one memory array within the data processor, the at least one memory array being coupled to the memory access control circuit;

wherein the switching circuit is used to provide the first power supply voltage to the at least one memory array in a normal mode of operation, and wherein the switching circuit is used to provide the second power supply voltage to the at least one memory array in a test mode of operation where a current supplied to the at least one memory array in the test mode of operation is capable of being measured by coupling a current sensing device to the second input terminal of the data processor;

wherein a current drawn by the CPU through the first input terminal is substantially decoupled from a current drawn by the at least one memory array through the second input terminal when in the test mode of operation; and wherein the test mode of operation may be used as a low power feature wherein the second power supply voltage is provided to the at least one memory array while the first power supply voltage which is being supplied to the CPU is lowered so that lower power is consumed in the data processor while data within the at least one memory array is maintained.

23. A method for testing an integrated circuit, the method comprising the steps of:

providing the integrated circuit wherein the integrated circuit internally has a plurality of memory banks, a switching circuit, and a central processing unit (CPU), the integrated circuit having a first external terminal for receiving a first power supply voltage and a second external terminal for receiving a second power supply voltage;

providing a first control signal from the CPU to the switching circuit to configure the switching circuit so that the first power supply voltage is supplied to the CPU while the second power supply voltage is supplied to the plurality of memory banks, wherein only a portion of the plurality of memory banks are selected to receive the second power supply voltage whereas a remaining portion of the plurality of memory banks continue to receive the first power supply voltage; and coupling a current measurement device to the second external terminal to measure a current which drawn through the plurality of memory banks while the second power supply voltage is being provided to the plurality of memory banks.

24. A method for testing an integrated circuit, the method comprising the steps of:

providing the integrated circuit wherein the integrated circuit internally has a plurality of memory banks, a switching circuit, and a central processing unit (CPU), the integrated circuit having a first external terminal for receiving a first power supply voltage and a second external terminal for receiving a second power supply voltage;

providing a first control signal from the CPU to the switching circuit to configure the switching circuit so that the first power supply voltage is supplied to the CPU while the second power supply voltage is supplied to the plurality of memory banks, wherein only one selected bit cell within the portion of the plurality of memory banks is selected to receive the second power supply voltage whereas a remaining portion of the plurality of memory banks continue to receive the first power supply voltage; and coupling a current measurement device to the second external terminal to measure a current which drawn through the plurality of memory banks while the second power supply voltage is being provided to the plurality of memory banks.

25. A method for testing an integrated circuit, the method comprising the steps of:

providing the integrated circuit wherein the integrated circuit internally has a plurality of memory banks, a switching circuit, and a central processing unit (CPU), the integrated circuit having a first external terminal for receiving a first power supply voltage and a second external terminal for receiving a second power supply voltage;

configuring the switching circuit so that the first power supply voltage is supplied to both the plurality of memory banks and the CPU when a reset of the integrated circuit is performed;

providing a first control signal from the CPU to the switching circuit to configure the switching circuit so that the first power supply voltage is supplied to the CPU while the second power supply voltage is supplied to the plurality of memory banks; and coupling a current measurement device to the second external terminal to measure a current which drawn through the plurality of memory banks while the second power supply voltage is being provided to the plurality of memory banks.

* * * * *